United States Patent [19]
Fischman et al.

[11] 3,993,930
[45] Nov. 23, 1976

[54] VERTICAL DEFLECTION SYSTEM

[75] Inventors: Martin Fischman, Seneca Falls;
Jesse H. L'Hommedieu, Waterloo,
both of N.Y.

[73] Assignee: GTE Sylvania Incorporated,
Stamford, Conn.

[22] Filed: June 16, 1975

[21] Appl. No.: 586,889

[52] U.S. Cl. .............................. 315/397; 315/403
[51] Int. Cl.² ..................... H01J 29/70; H01J 29/76
[58] Field of Search ........................... 315/397, 396

[56] References Cited
UNITED STATES PATENTS 3,887,842  6/1975  Owens et al. ....................... 315/397

*Primary Examiner*—Maynard R. Wilbur
*Assistant Examiner*—David Leland
*Attorney, Agent, or Firm*—Norman J. O'Malley;
Robert E. Walrath; Robert T. Orner

[57] ABSTRACT

A vertical deflection system including a driver circuit energized by a voltage source having a sufficient magnitude to provide a trace deflection signal to the vertical deflection winding and a retrace voltage source switched into the circuit with the vertical deflection winding to provide adequate voltage for effecting vertical retrace of the electron beam deflection in a cathode ray tube is disclosed.

8 Claims, 4 Drawing Figures

VERTICAL DEFLECTION SYSTEM

FIELD OF THE INVENTION

This invention relates to vertical deflection systems for electromagnetically deflecting electron beams in cathode ray tubes and more particularly to low power vertical deflection systems.

BACKGROUND OF THE INVENTION

In systems utilizing cathode ray tube display devices, such as television receivers, the electron beam or beams in the cathode ray tube are typically deflected electromagnetically in horizontal and vertical directions to create a raster on the screen of the cathode ray tube. The horizontal deflection or line rate is typically high, such as the 15,734 lines per second used in the NTSC system, while the vertical deflection or field rate is typically low, such as the 60 fields per second used in television practice.

In television receivers a high percentage of the total power utilized is consumed by the deflection system with the horizontal deflection system requiring substantially more power than the vertical deflection system. Horizontal deflection is typically accomplished by the use of switching devices such as transistors, silicon controlled rectifiers, and/or diodes in various combinations such that the switching devices are either fully conducting or non-conducting so that the power consumption by the deflection circuit itself is minimized. Relatively linear deflection of the electron beams in a cathode ray tube can be obtained with switching circuitry in the horizontal deflection system due to the high deflection rate relative to the L/R time constant of the inductive circuit. Furthermore, power recovery systems have also been widely used for many years in horizontal deflection to minimize the power consumed by the deflection system.

While the vertical deflection system consumes less power than the horizontal deflection system, substantial excess power is dissipated in the vertical deflection system which could be desirably conserved. Vertical deflection systems, however, with their lower deflection rate generally do not lend themselves to energy conservative switching circuitry because of the low deflection rate relative to the L/R time constant of the inductive circuit. In typical prior art practice, sawtooth driving voltages are required to drive a sawtooth current through the resistive component of the vertical deflection winding. The driving voltage has a form $e(t) = Ldi/dt + Ri$ where $L$ and $R$ are the inductance and resistance of the vertical deflection winding. During the relatively long trace interval, the $Ldi/dt$ term requires only a small constant voltage to provide a sawtooth deflection current, however, the $Ri$ term requires a substantial voltage which must be of a sawtooth or ramp waveform to provide the desired linear deflection. The power consumed in the vertical deflection winding is $(I_p)^2 R/3$, where $I_p$ is the peak current of the sawtooth, which represents the power lost in the resistance of the winding during trace. This power loss is dictated by the L/R ratio of the deflection winding.

Additional power is consumed by the vertical deflection circuit and particularly by the vertical driver circuit. Various types of vertical driver circuits are known (including the socalled class D driver which uses pulse width modulation techniques and switching components), but the class B transistor driver is generally considered the most efficient driver in general use in modern television receivers. The efficiency of class B drivers in the ideal case approaches ⅔ where efficiency is defined as a ratio of power consumed in the yoke to the total power consumed in the yoke and drive. As a practical matter, the efficiency is usually lower due to transistor and other circuit voltage drops.

The above discussion concerned the relatively long trace interval of about 16 milliseconds. The deflection circuit must also, of course, provide retrace during the relatively short retrace interval of about 600 microseconds. The $Ldi/dt$ term of the voltage equation for the deflection winding requires a relatively high voltage because the retrace time is short. In the prior art practice the power or voltage supply used to energize the driver circuit must provide a voltage sufficient to provide the higher retrace voltage requirement. This higher voltage, however, is also provided during trace so that the driver circuit must drop the higher voltage thereby consuming substantial additional power.

Prior attempts to circumvent this problem includes such expediencies as sharply cutting off the current to the deflectiion winding, multiplying the power supply voltage (for example, by switching a charged capacitor in series with the power supply during retrace), extending the retrace interval, and other similar expediencies, none of which have been wholly satisfactory. For example, lengthening the retrace interval is undesirable and forces other design compromises. Sharp cutoff of the deflection current requires close tolerances to achieve satisfactory deflection and can undesirably increase the expense and complexity of componenets. Attempts to boost the supply voltage still consume excessive power and do not have the flexibility to accomodate wide L/R deflection winding ratios.

OBJECTS OF THE INVENTION

Accordingly, it is a primary object of this invention to obviate the above noted and other disadvantages of the prior art.

It is a further object of this invention to provide a highly efficient vertical deflection system.

It is a further object of this invention to provide a vertical deflection system energized by power supplies or voltage sources of minimal magnitude.

It is a yet further object of this invention to provide a low power vertical deflection system without deleteriously affecting performance.

SUMMARY OF THE INVENTION

In one aspect of this invention the above and other objects and advantages are achieved in a vertical deflection system for a cathode ray tube having a vertiical deflection winding associated therewith. The vertical deflection system includes a first or trace voltage source, a sawtooth signal generating means, a second or retrace voltage source independent of the first or trace voltage source, and switching means. The sawtooth signal generating means is connected to the vertical deflection winding and the first or trace voltage source for providing a trace scanning signal to the vertical deflection winding for causing electron beam deflection in the cathode ray tube. The switching means connects the second or retrace voltage source in circuit with the vertical deflection winding to provide a voltage to the vertical deflection winding only during retrace intervals of sufficient magnitude for effecting vertical retrace of the electron beam deflection in the cathode ray tube.

DETAILED DESCRIPTION OF THE PREFERRED EMBODIMENTS

For a better understanding of the present invention, together with other and further objects, advantages and capabilities thereof, reference is made to the following disclosure in conjunction with the accompanying drawings.

Figure 1:
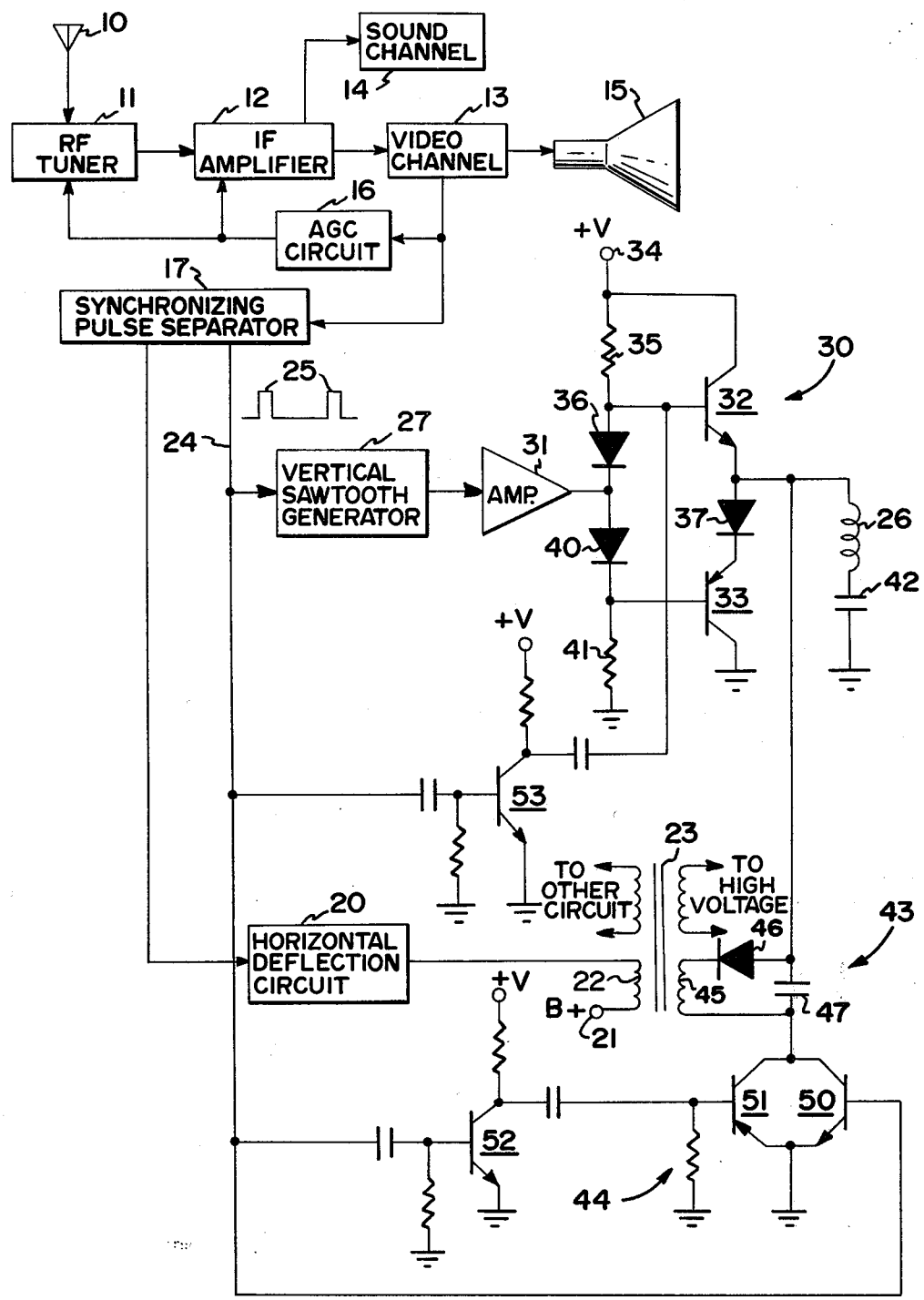
FIG. 1 is a block and schematic diagram of one embodiment of the invention incorporated in a television receiver.

In FIG. 1 a preferred embodiment of the invention is illustrated schematically incorporated in a television receiver with typical television receiver circuitry components illustrated in block diagram form. An antenna or equivalent signal receiving means 10 is connected to a radio frequency (RF) tuner 11 which heterodynes the received television signal to an intermediate frequency (IF). The IF output of RF tuner 11 is amplified by an IF amplifier 12 and coupled to a video channel 13 with the sound portion of the IF signal being coupled to a sound channel 14. The composite video signal is detected and amplified in video channel 13 for application to a cathode ray tube (CRT) 15. In the case of a color television receiver, video channel 13 includes both luminance and chrominance circuitry and CRT 15 is a color CRT. The composite video signal from video channel 13 is coupled to an automatic gain control (AGC) circuit 16 which provides gain control signals to RF tuner 11 and IF amplifier 12. The composite video signal is also coupled to a synchronizing pulse separator 17 which separates the horizontal and vertical synchronizing pulses from the composite video signal and couples the pulses to horizontal and vertical deflection systems.

The horizontal deflection system includes a horizontal deflection circuit 20 which is energized by a voltage source illustrated as a terminal 12 connected via a primary winding 22 of a horizontal output transformer 23 to horizontal deflection circuit 20. Horizontal deflection circuit 20 drives transformer 23 as well as the horizontal deflection winding (not shown) of the yoke associated with CRT 15. In accordance with the usual television receiver practice, the high voltage applied to the second anode of CRT 15 and various gating and blanking signals can be derived from secondary windings of transformer 23.

An output lead 24 of synchronizing pulse separator 17 couples separated vertical synchronizing pulses 25 to the vertical deflection system. In the illustrated embodiment vertical synchronizing pulses 25 are illustrated as being positivegoing pulses, however, negative-going pulses can be used as well. The vertical deflection system includes a sawtooth signal generating means connected to a vertical deflection winding 26 included in a yoke together with the horizontal deflection winding and positioned about the neck of CRT 15. The sawtooth signal generating means provides a trace scanning signal to winding 26 for causing electron beam deflection in CRT 15.

The sawtooth signal generating means includes a vertical sawtooth signal generator 27 connected to lead 24 to receive the synchronizing pulses 25. Signal generator 27 is connected to a driver circuit 30 by an amplifier 31. Sawtooth generator 27 provides a sawtooth voltage via amplifier 31 to driver circuit 30 which is illustrated as a class B driver. Driver 30 includes complimentary transistors 32 and 33 energized by a first or trace voltage source or power supply illustrated as a terminal 34. Source 34 is connected to a collector of NPN transistor 32 and by a resistor 35 to a base of transistor 32. The base of transistor 32 is further connected by an off-set diode 36 to the output of amplifier 31. An emitter of transistor 32 is connected by a blocking diode 37 to an emitter of PNP transistor 33 which has a collector connected to circuit ground. The output of amplifier 31 is connected by an off-set diode 40 to a base of transistor 33 which is further connected by a resistor 41 to circuit ground. The junction of the emitter of transistor 32 and diode 37 is connected to one end of vertical deflection winding 26, the other end of which is connected by a coupling capacitor 42 to circuit ground.

The vertical deflection system described thus far is more or less typical of those found in modern television receivers. The sawtooth signal provided by amplifier 31 causes alternate conduction by transistors 32 and 33 to provide electron beam deflection in cathode ray tube 15 by deflection winding 26.

Figure 2A:
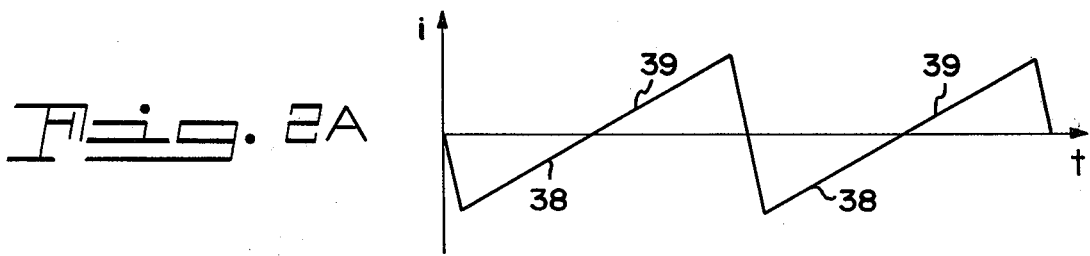
FIGS. 2A and 2B are current and voltage waveform diagrams to aid in explaining the operation of the invention.
Figure 2B:
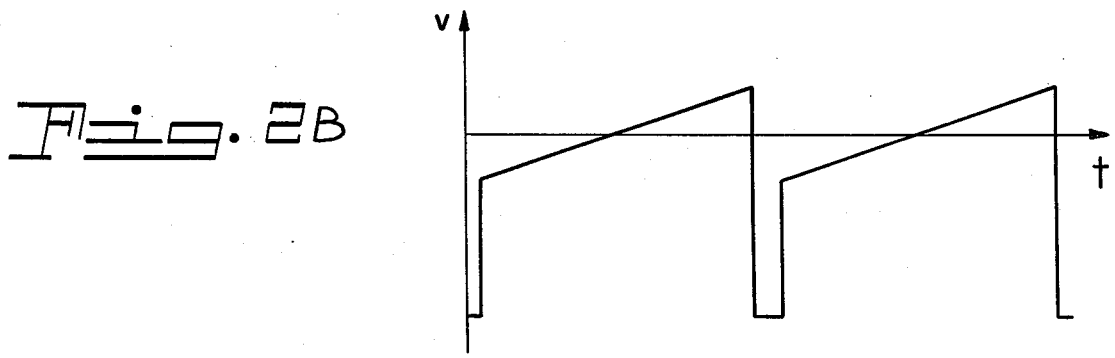

The current and voltage waveforms necessary to provide proper vertical deflection are illustrated in FIGS. 2A and 2B. At the start of trace, transistor 33 conducts current from winding 26 to scan the top half of the raster. The current through transistor 33 is illustrated in FIG. 2A by the negative portions 38 of the trace waveform. When the electron beam in CRT 15 is scanning at approximately the center of the screen, transistor 33 ceases conduction and transistor 32 provides a linearly increasing current 39 to winding 26 to complete scanning of the bottom half of the raster.

As was discussed above, a relatively low drive voltage is required for the long trace interval. Accordingly, the magnitude of source 34 is determined by the minimum energizing voltage required to effect vertical trace which is primarily dictated by the resistance of winding 26.

The retrace interval is initiated by vertical synchronizing pulses 25 at the end of the trace interval. During the retrace interval, the current through winding 26 must be reversed in a relatively short time as is shown in FIG. 2A. Reversal of the current in winding 26 requires a relatively high magnitude voltage which in prior art drivers is supplied either directly or indirectly by the source equivalent to source 34. Since this source in prior art drivers must provide both a relatively low drive during trace and relatively high drive during retrace, the relatively high drive during retrace dictates the magnitude of the source. During trace, however, the additional or excessive voltage supplied by the voltage source must be dropped by the driver transistors as well as other circuitry thereby dissipating the additional energy as heat. Accordingly, substantial power is wasted in excessive dissipation by the driver circuit.

In accordance with the invention, a second or retrace voltage source 43 and switching means 44 are connected in circuit with vertical deflection winding 26 to provide a high magnitude voltage to vertical deflection winding 26 during retrace intervals. Thus, the magnitude of source 34 can be decreased from the magnitude required by prior art vertical deflection systems to that necessary for electron beam deflection in CRT 15 during trace intervals while source 43 is switched into circuit with winding 26 only during retrace intervals to provide the additional voltage magnitude required for effecting vertical retrace of the electron beam deflection in CRT 15. Source 43 is preferably independent of source 34 so that the magnitude of source 43 can be independently determined to be of sufficient magnitude for effecting vertical retrace.

In the illustrated embodiment voltage source 34 is derived from a secondary winding 45 on transformer 23. Pulses appearing across winding 45 during horizontal retrace are rectified by a diode 46 to develop a voltage across a capacitor 47. One plate of capacitor 47 is connected to the junction between driver circuit 30 and winding 26 while the other plate of capacitor 47 is connected to switching means 44.

Switching means 44 includes an NPN transistor 50 which has a collector connected to capacitor 47, an emitter connected to circuit ground, and a base connected to conductor 24 to receive synchronizing pulses 25. When synchronizing pulses 25 initiate retrace, transistor 50 is switched on to complete a circuit including voltage source 43 and winding 26. In the illustrated arrangement source 43 provides a high magnitude voltage to winding 26 which is negative with respect to ground.

As is evident from FIG. 2A, during the first half of retrace, the current flow through winding 26 decreases from a maximum toward zero which would cause current flow from the emitter to the collector of transistor 50. While it has been found that in practice some transistors may provide sufficient reverse current flow to supply current to winding 26 during the first half of retrace, in some applications a single transistor may be insufficient. Accordingly, in the illustrated embodiment switch 44 includes a PNP transistor 51 having an emitter connected to circuit ground and a collector connected to capacitor 47. Vertical synchronizing pulses 25 are coupled from conductor 24 via an inverter 52 to the base of transistor 51 so that transistors 50 and 51 together provide a bi-lateral switch for conducting current both to and from vertical deflection winding 26.

In the illustrated arrangement the negative voltage at the emitter of transistor 32 during retrace may cause conduction by transistor 32. In order to hold transistor 32 in a nonconducting condition during retrace, switching means 44 includes a transistor switch 53. Transistor switch 53 is connected to receive vertical synchronizing pulses 25, which are inverted and coupled to the base of transistor 32 to switch transistor 32 to a non-conducting condition during retrace intervals.

Figure 3:
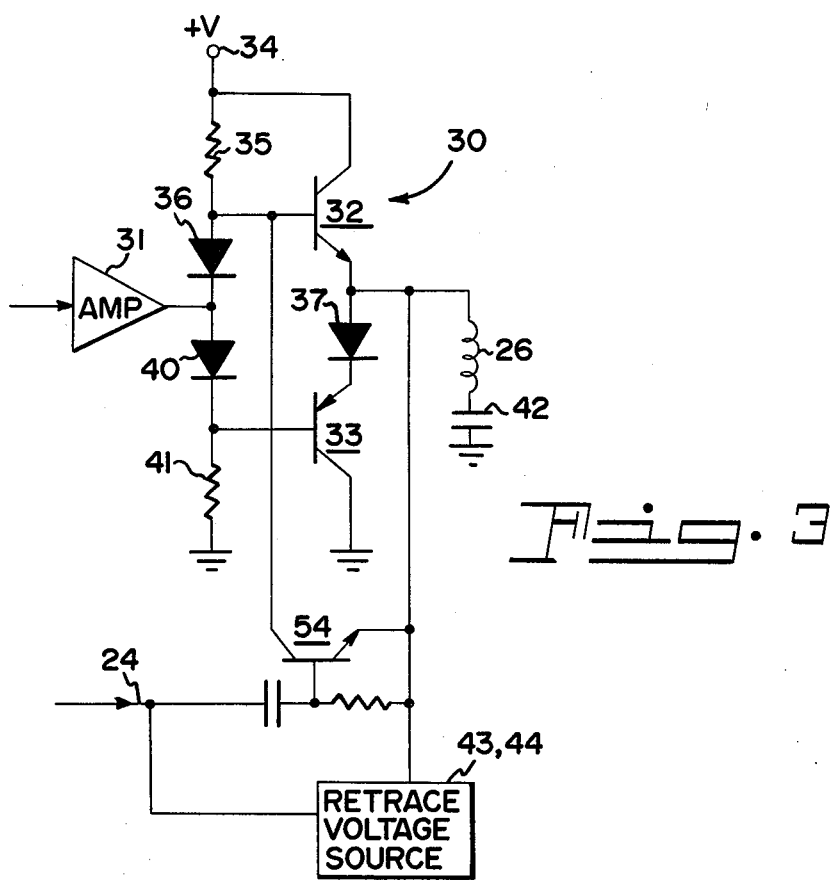
FIG. 3 is a block and schematic diagram of an alternate embodiment of the invention.

The embodiment of the invention illustrated in FIG. 3 is similar to that illustrated in FIG. 1 and the same reference numerals are used therein. In FIG. 3 switch 53 is replaced by a switch 54 which during retrace intervals shorts the base and emitter of transistor 32 to switch transistor 32 to a nonconducting condition. As a further alternative, in some applications it may be sufficient to connect a capacitor between the base and emitter of transistor 32 so that when switching means 44 connects source 43 in circuit with winding 26, the capacitor will hold transistor 32 in a non-conducting condition.

Those skilled in the art will realize that numerous other modifications of the disclosed invention can be made. For example, source 43 is shown as a floating supply which is grounded by switching means 44. Alternatively, switching means 44 can be floated if desired or necessary. Also, voltage source 43 can be derived other than from the horizontal output transformer and can be switched into circuit with winding 26 through techniques other than the one illustrated and described. Additionally, with other types of driver circuits 30 the hold-off function of transistor switches 53 or 54 may be unnecessary. Those skilled in the art will also realize that various additional features can be incorporated within the scope of the invention. For example, linearity circuitry may be added to the vertical deflection system. Similarly, it is common to include a stability resistor between the emitters of transistors 32 and 33 in class B drivers. These and many other circuit refinements and variations will be evident to those skilled in the art.

Accordingly, an embodiment of the invention has been illustrated and described wherein separate trace and retrace voltage sources are utilized. The magnitude of each voltage source is determined independently to both optimize performance and power saving. The individual magnitudes of the voltage sources are dependent primarily on the L/R ratio of the vertical deflection winding, given a particular deflection winding and yoke design and CRT. In practice a power saving of 50% over prior art vertical deflection systems can be obtained depending upon circuit design and the L/R ratio of the deflection winding. In general, the higher the L/R ratio, the greater the power saving achievable over prior art practices.

While there has been shown and described what is at present considered the preferred embodiments of the invention it will be obvious to those skilled in the art that various changes and modifications may be made therein without departing from the invention as defined by the appended claims.

What is claimed is:

1. A vertical deflection system for a cathode ray tube having a vertical deflection winding associated therewith comprising:
    a sawtooth signal generator;
    a driver circuit connected to said sawtooth signal generator and to said vertical deflection winding for providing a trace scanning signal to said vertical deflection winding for causing electron beam deflection in said cathode ray tube;
    a trace voltage source connected to said driver circuit for providing an energizing voltage thereto for supplying power to said vertical deflection winding during trace intervals;
    a retrace voltage source independent of said trace voltage source; switching means connecting said retrace voltage source in circuit with said vertical deflection winding for providing a voltage to said vertical deflection winding only during retrace intervals of sufficient magnitude for effecting vertical retrace of the electron beam deflection in said cathode ray tube; and
    means connecting said switching means to said driver circuit for switching said driver circuit to a non-conducting condition during retrace intervals.

2. A vertical deflection circuit as defined in claim 1 wherein said switching means includes a bi-lateral switch for conducting current both to and from said vertical deflection winding.

3. A vertical deflection circuit as defined in claim 1 wherein said retrace voltage source is connected to a horizontal deflection system and derives the voltage provided thereby by rectification of pulses during horizontal retrace intervals.

4. In a television receiver having a video channel, a cathode ray tube connected to said video channel, a synchronizing pulse separator connected to said video channel, and a horizontal deflection system connected to said synchronizing pulse separator for electron beam deflection in said cathode ray tube, a vertical deflection system having a vertical deflection winding associated with said cathode ray tube comprising:
- a sawtooth signal generator connected to said synchronizing pulse separator;
- a first voltage source;
- a driver circuit connected to said sawtooth signal generator, to said first voltage source, and to one end of said vertical deflection winding for providing vertical trace electron beam deflection in said cathode ray tube;
- a second voltage source independent of said first voltage source; and
- switching means connected to said synchronizing pulse separator and in circuit with said second voltage source and said vertical deflection winding for connecting said second voltage source in a series circuit with said vertical deflection winding exclusive of said driver circuit for providing a voltage to said vertical deflection winding only during retrace intervals of sufficient magnitude for effecting vertical retrace of the electron beam deflection in said cathode ray tube.

5. A vertical deflection system as defined in claim 4 wherein said second voltage source has a first terminal connected to said one end of said vertical deflection winding and a second terminal connected to said switching means.

6. A vertical deflection system as defined in claim 5 wherein said switching means includes a bi-lateral switch for conducting current both to and from said vertical deflection winding.

7. A vertical deflection system as defined in claim 5 wherein said second voltage source is connected to said horizontal deflection system and derives the voltage provided thereby by rectification of pulses during horizontal retrace intervals.

8. A vertical deflection system as defined in claim 5 wherein said switching means is further connected to said driver circuit for switching said driver circuit to a non-conducting condition during retrace intervals.

* * * * *

UNITED STATES PATENT AND TRADEMARK OFFICE
CERTIFICATE OF CORRECTION

PATENT NO. : 3,993,930
DATED : Nov. 23, 1976
INVENTOR(S) : MARTIN FISCHMAN and JESSE H. L'HOMMEDIEU It is certified that error appears in the above-identified patent and that said Letters Patent are hereby corrected as shown below:

Col. 2, line 6 - delete "drive" and insert "driver".

Col. 2, line 24 - delete "deflectiion" and insert -- "deflection" --.

Col. 2, line 33 - delete "componenets" and insert -- "components" --.

Col. 3, line 46 - delete "12" and insert -- "21" --.

Signed and Sealed this

Fifteenth Day of February 1977

[SEAL]

Attest:

RUTH C. MASON
Attesting Officer

C. MARSHALL DANN
Commissioner of Patents and Trademarks